Feb. 11, 1964 S. BERNSTEIN-BERVERY ETAL 3,121,201

DIRECT COUPLED NEGATIVE FEEDBACK HYBRID AMPLIFIER

Filed Nov. 14, 1960 2 Sheets-Sheet 1

INVENTORS
SERGIO BERNSTEIN-BERVERY
JOHN W. GRAY

BY H. S. Mackey

ATTORNEY.

DIRECT COUPLED NEGATIVE FEEDBACK HYBRID AMPLIFIER

Filed Nov. 14, 1960 2 Sheets-Sheet 2

INVENTOR.
SERGIO BERNSTEIN-BERVERY
JOHN W. GRAY
BY H. A. Mackey
ATTORNEY.

3,121,201

DIRECT COUPLED NEGATIVE FEEDBACK HYBRID AMPLIFIER

Sergio Bernstein-Bervery, Valhalla, and John W. Gray, Pleasantville, N.Y., assignors to General Precision, Inc., a corporation of Delaware Filed Nov. 14, 1960, Ser. No. 69,206
3 Claims. (Cl. 330—3)

This invention relates generally to electronic amplifiers and particularly to alternating current signal amplifiers having high input impedance, high gain, high linearity, high stability, and low output impedance.

In designing a linear, high gain, high input impedance amplifier, the engineer must weigh the requirements and choose the general approach to the problem. The requirement of high gain ordinarily requires the use of two or more stages of amplification, while the requirement of high linearity suggests the use of negative feedback. If the stages are reactively coupled, as by resistance-capacitance networks, the phase shift introduced by these networks must be considered in order to avoid the possibility of positive feedback at any frequency and the resulting instability. If the stages be direct coupled, provision must be made for direct current stabilization, especially if transistors are to be used. In the absence of such stabilization, the unidirectional voltages and currents may drift and cause the tubes or transistors to operate at an unfavorable portion of their characteristic curves or may even cause complete saturation or cutoff such as to prevent amplification. The requirement for high input impedance is especially troublesome with transistors because, unlike vacuum tubes, transistors require an appreciable input current in order to operate.

In the past, the various problems mentioned above have been but partially overcome. In general, the approach has been to consider each problem separately and solve it separately. For example, direct current stabilization has been obtained by providing voltage dividers across the power supply in each stage. While this arrangement provides the necessary stabilization, it requires many components and the dividers consume a considerable amount of power. Another solution to the stabilization problem is to employ large D.C. negative feedback, but when the feedback is made great enough to provide adequate stabilization, the overall gain is too low for most purposes. As another example, a reasonably high input impedance can be obtained by making the first stage a cathode follower, in the case of a vacuum tube, or an emitter follower, in the case of a transistor. However, such arrangements, especially the emitter follower, do not yield an input impedance high enough for many critical applications. In short, there has been no amplifier available in the past which satisfactorily combines the features of simplicity, high gain, high linearity, stable operation, and high input impedance. Hitherto, these features have been to a considerable extent, mutually exclusive.

It is a general object of the present invention to provide an improved alternating current signal amplifier.

Another object is to provide a simple alternating current signal amplifier affording stability, high linearity, high gain and having a high input impedance.

Another object is to provide an amplifier circuit which may employ either transistors or tubes or both in order to obtain stability, high linearity, high gain and a high input impedance.

Briefly stated, the invention comprises, in its most general form, a two section direct-coupled amplifier. A negative feedback path, conductive to both direct current and alternating current, is provided from the output terminal to the input section. The portion of the output fed back to the input is determined by a two part voltage divider, one part conductive to both alternating current and direct current, and the other part conductive to alternating current only. Thus it is possible to select the alternating and direct current feedback factors separately. The D.C. feedback factor is made very high so as to obtain excellent D.C. stability while the A.C. feedback is made lower so as to obtain high gain. At the same time, the input circuit of the first stage is "bootstrapped," that is, tied in to the alternating current portion of the feedback path so that voltage changes of the input signal cause very little change in input current. The latter feature secures a high input impedance.

For a clearer understanding of the invention, reference may be made to the following detailed description and the accompanying drawing, in which.

Figure 1:
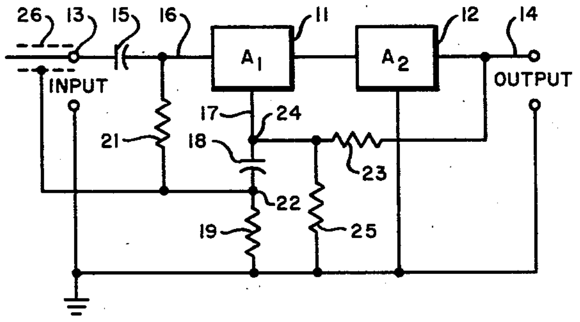
FIGURE 1 is schematic diagram, partly in block form, illustrating the invention generally.

Referring first to FIGURE 1, there is shown a direct coupled amplifier composed of two sections, 11 and 12. The expression "section" is used, rather than "stage," because each section may employ one or more stages each including an electronic valve such as a vacuum tube or a transistor. Direct coupling is employed throughout, both between sections and between stages within each section, if one or both sections comprise a plurality of stages.

The alternating current input signal to be amplified is applied between a terminal 13 and ground while the amplified output voltage appears between an output conductor 14 and ground. The terminal 13 is coupled by means of a capacitor 15 to an input conductor 16 which in turn is directly connected to the section 11. The capacitor 15 is of sufficient size to constitute a low impedance to all frequencies within the band of interest.

An electronic amplifier stage inherently has two input points between which the input signal is applied. In the usual vacuum tube amplifier, for example, the input signal is applied fully or partially between grid and cathode, regardless of whether the grid, the cathode, or the anode is grounded. In FIGURE 1, the two input points are the input conductor 16 and a conductor 17. The conductor 17 is connected through the series combination of a capacitor 18 and a resistor 19 to ground. The capacitor 18 has sufficient capacitance to constitute a very low impedance for all signal frequencies of interest. Thus the input signal to section 11 is applied to the conductors 16 and 17 through the resistor 19 and the capacitor 18.

A resistor 21 has one terminal connected to the input conductor 16 and, while the other terminal might in some cases be connected directly to ground, it is preferred that it be connected to the junction 22 of the capacitor 18 and the resistor 19 as shown in FIGURE 1.

In amplifiers, generally speaking, negative feedback may be applied to the appropriate input point, depending upon the phase of the output voltage with respect to the input. For example, in a two stage vacuum tube amplifier with each stage connected in the usual common cathode configuration, negative feedback is obtained by applying a portion of the voltage appearing on the anode of the second tube to the cathode of the first tube. If the amplifier has an odd number of stages, such as one or three, negative feedback may be obtained by applying a portion of the output voltage to the grid of the first tube. In the present invention it is preferred that the two sections 11 and 12 together have such a number and kind of stages that the phase of the output voltage is the same as that of the input. Accordingly, negative feedback is obtained by connecting a resistor 23 between the output conductor 14 and the junction 24 of the conductor 17 and the capacitor 18. This connection may require the use of a resistor 25 connected from the junction 24 to ground or to a potential source if the unidirectional currents through the conductor 17 and the resistor 23 are not equal. While, as will be illustrated subsequently, some specific embodiments do not require the resistor 25, FIGURE 1 is intended to illustrate the general case and accordingly this resistor is shown.

In operation, the portion of the output voltage fed back to the input is determined by those components constituting a voltage divider across the output, that is, the resistor 23, the capacitor 18, the resistor 19, and the resistor 25. In the case of the unidirectional component of the output voltage, the voltage divider consists of the resistor 23 in series with the resistor 25. The portion of the voltage feed back is that portion developed across the resistor 25, because the input circuit also includes the resistor 25 in parallel with the series combination of capacitor 18 and resistor 19. Accordingly, the resistor 25 should be made as large as possible consistent with voltage and current requirements of the circuit since larger values of resistor 25 afford larger proportions of unidirectional negative feedback. It is preferred that resistor 25 be as large as or larger than resistor 23 so that 50% or more of the unidirectional output voltage is fed back thereby assuring excellent direct current stability.

In considering the alternating component of the output voltage, the voltage divider across the output consists of the resistor 23, the resistor 25, the capacitor 18 and the resistor 19. However, since the capacitor 18 has a very low impedance for signal frequencies and since the resistor 19 is made small compared to resistors 23 and 25, the voltage divider for alternating currents is effectively the resistor 23 in series with the resistor 19. Thus, by suitably selecting the values of resistor 23 and resistor 19, any desired amount of alternating current negative feedback may be obtained. The resistor 19 is usually made small enough compared to the resistor 23 to keep the alternating current negative feedback down to a value consistent with high overall gain, gain stability, and good linearity.

The negative feedback circuit as above described is not to be confused with the well known frequency selective feedback networks, sometimes called tone control circuits, compensating circuits, or warping circuits. Such circuits normally provide feedback which varies smoothly with frequency so as to obtain a desired overall frequency response characteristic. In contrast, the circuit of the present invention is capable of providing the same amount of negative feedback for all frequencies for which the amplifier is designed and at the same time providing a vastly different amount of unidirectional voltage feedback.

As far as the feedback circuit above described is concerned, the terminal of the resistor 21 remote from the conductor 16 could have been connected directly to ground. However, its connection to the junction 22 has a beneficial effect. Consider a short period of time when the input signal is becoming more positive with respect to ground. This causes the output voltage on conductor 14, the junction 22 and the lower end of the resistor 21 to become more positive. Thus, although the input voltage rises, very little increase occurs in the current through resistor 21. Likewise, little current increase occurs through the conductor 17. The total input current therefore changes but little and since the input impedance is the ratio of incremental voltage change to incremental current change, the impedance presented to the source of input signals is very high.

As previously stated, the input signal to be amplified is applied between the terminal 13 and ground. Frequently signals to be amplified are led to the amplifier by a line enclosed in a shield, such as the shield 26, in order to reduce noise induced by stray fields. The shunting effect of the capacitance of the shielded line on the signal source may be minimized by also connecting the shield to the junction 22, instead of to ground, so that the potential of the shield varies with the fluctuations of the input signal.

Circuits such as above described wherein the lower end of resistor 21, or the shield 26, or other circuit elements, are returned to a point the potential of which varies with the input signal, are often called "bootstrapping" circuits and will be referred to as such from time to time in the present application.

Figure 2:
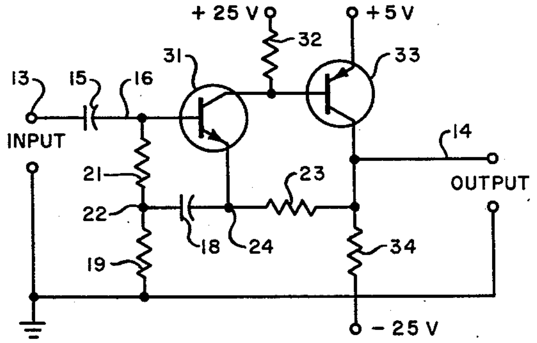
FIGURE 2 is a schematic diagram of a specific embodiment of the invention which employs two transistors.

Specific embodiments of the invention will now be described with reference to FIGURES 2–5. Referring to FIGURE 2, there is shown a very simple embodiment employing two transistors of complementary symmetrical type, that is, one NPN transistor and one PNP transistor, each connected in a common emitter amplifying circuit. The input conductor 16 is connected to the base of an NPN transistor 31 the emitter of which is connected to the junction 24. The collector of the transistor 31 is connected to a source of positive potential through a load resistor 32 and is also directly connected to the base of a PNP transistor 33. The emitter of transistor 33 is connected directly to a low voltage source of positive potential while the collector of transistor 33 is connected through a load resistor 34 to a source of negative potential. The output conductor 14 is connected directly to the collector of transistor 33. The remaining connections are the same as those of FIGURE 1 and like components are denoted by like reference characters. It is noted that resistor 25 is not required, that is, it has infinite resistance.

Operation is like that described in connection with FIGURE 1. Feedback is from the output to the emitter of the transistor 31. Since resistor 25 is infinite, direct current feedback is substantially 100%, affording excellent stability, while alternating voltage feedback is much lower, on the order of 1% if resistor 19 is made one one-hundredth of resistor 23.

The embodiment of FIGURE 2 has the advantage of simplicity. Although neither the input impedance, nor the capability of high A.C. gain, nor the A.C. gain stability are as great as can be achieved with more elaborate circuits, nevertheless the circuit of FIGURE 2 is more than adequate for many purposes.

By way of example, an amplifier for use with audio frequencies above 60 cycles may be constructed in accordance with FIGURE 2 using the following components.

| | |
|---|---|
| Transistor 31 | Type 2N336. |
| Transistor 33 | Type 2N597. |
| Capacitor 15 | 0.1 microfarad. |
| Capacitor 18 | 330 microfarads. |
| Resistor 19 | 270 ohms. |
| Resistor 21 | 47,000 ohms. |
| Resistor 23 | 27,000 ohms. |
| Resistor 32 | 68,000 ohms. |
| Resistor 34 | 10,000 ohms. |
| Power supply | +5 volts, +25 volts, −25 volts as indicated. |

An amplifier constructed as above indicated has been found to be very satisfactory. Tests have shown it to have a gain of 100, an output impedance of 60 ohms, and an input impedance of one megohm.

Figure 3:
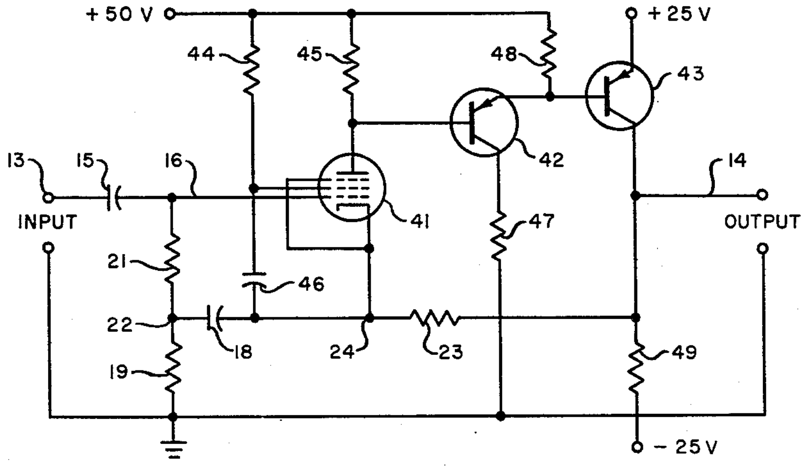
FIGURE 3 is a schematic diagram of another embodiment which uses a vacuum tube and two transistors.

In those applications in which extremely high input impedance is required the configuration of FIGURE 3 may be used. In this embodiment the first amplifying section comprises a pentode vacuum tube 41 while the second section comprises two transistors 42 and 43. The tube 41 has its cathode connected to the junction 24, its control grid connected to the conductor 16, its screen connected through a resistor 44 to a source of positive potential, and its anode connected through a load resistor 45 to a source of positive potential. Additionally, the screen is coupled to the cathode by a capacitor 46.

The anode of the tube 41 is direct coupled to the base of the PNP transistor 42, the collector of which is connected through a resistor 47 to ground. The emitter of the transistor 42 is connected through a load resistor 48 to a source of positive potential and is also connected directly to the base of the transistor 43. The emitter of the transistor 43 is connected directly to a source of positive potential while the collector is connected through a load resistor 49 to a source of negative potential. The output conductor 14 is connected directly to the collector of the transistor 43.

It is apparent that the transistor 42 is connected in a common collector, or emitter follower, circuit in which the resistor 48 is the load resistor. The resistor 47 in the collector circuit is a protective current limiting resistor. It is possible that high level signal currents may increase the emitter currents of transistors 42 and 43 to such an extent that, in the absence of resistor 47, both transistors would be destroyed. The resistor 47 limits the emitter currents to a safe value, without significantly affecting the normal gain.

The common collector connection of the transistor 42 provides a high input impedance and a large current gain with a low output impedance which is ideal for driving the common emitter stage of transistor 43 very effectively. The two transistors 42 and 43 thus provide very high overall gain.

Operation of the embodiment of FIGURE 3 is similar to that of FIGURES 1 and 2. Unidirectional negative feedback from the output to the cathode of the pentode tube 41 is substantially 100%, affording excellent direct current stability. As before, the amount of alternating current feedback is controlled by selecting the relative values of resistors 19 and 23. Input impedance is very high, first because of the inherently high input impedance of a vacuum tube as compared to a transistor; second because the negative feedback connection to the cathode bootstraps the cathode; third because the control grid is bootstrapped by the connection of the resistor 21 to the junction 22; and fourth because the screen bypass capacitor 46 is connected, not to ground, but to the junction 24 thereby boostrapping the screen.

Figure 4:
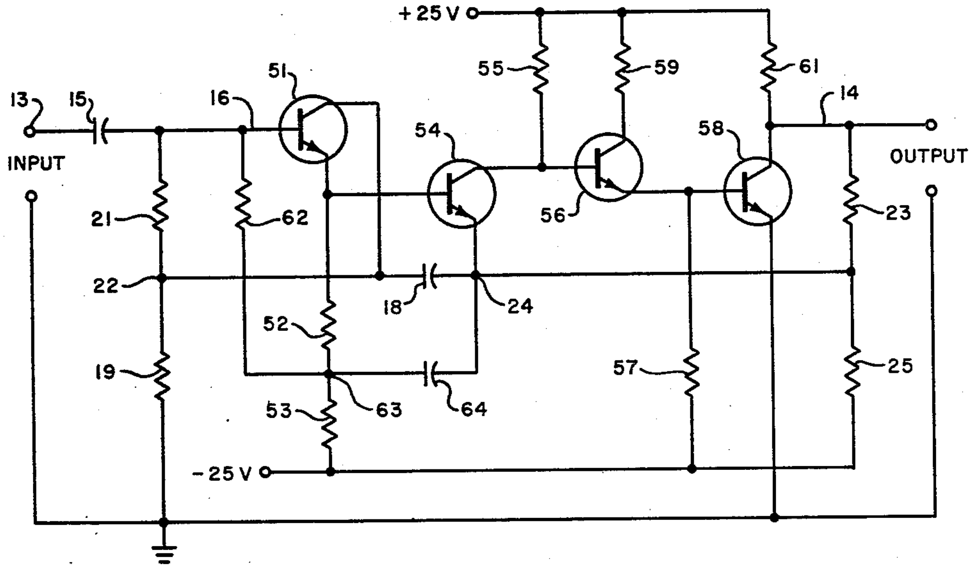
FIGURE 4 is a schematic diagram of another embodiment in which the two sections of the amplifier each employ two transistors.

The arrangement of FIGURE 4 provides high gain and high gain stability in an all transistor circuit. Each amplifying section employs two transistors, the first connected in a common collector circuit direct coupled to the second connected in a common emitter circuit, similar to the circuit of transistors 42 and 43 of FIGURE 3. More specifically, the input conductor 16 is connected directly to the base of a transistor 51, the collector of which is connected to the junction 22. The emitter of transistor 51 is connected through a resistance comprising serially connected resistors 52 and 53 to a source of negative potential. Said emitter is also directly connected to the base of a transistor 54, the emitter of which is connected to the junction 24. The collector of the transistor 54 is connected through a load resistor 55 to a source of positive potential and is also directly connected to the base of a transistor 56. The transistor 56 is connected as an emitter follower, the emitter being connected through a load resistor 57 to a source of negative potential and also being directly connected to the base of a transistor 58. The collector of the transistor 56 is connected to a source of positive potential through a protective current limiting resistor 59, which serves the same purpose as the resistor 47 of FIGURE 3. The emitter of the transistor 58 is grounded while the collector is connected through a load resistor 61 to a source of positive potential. The output conductor 14 is connected directly to the collector of the transistor 58.

Feedback is similar to that of the previously described embodiments. The voltage divider across the output comprises, in part, the resistor 23, the capacitor 18, and the resistor 19. Feedback is to the emitter of the transistor 54, to which the junction 24 is connected. However, the voltages and currents of the emitter of the transistor 54 and the collector of the transistor 58 require the inclusion of the resistor 25 connected from the junction 24 to a source of negative potential, as previously discussed in connection with FIGURE 1. The resistor 25 is preferably as large or larger than the resistor 23 to keep the unidirectional feedback 50% or higher.

As before, the junction 22 is connected to the lower end of the resistor 21 to bootstrap the base of the transistor 51. An additional resistor 62 is provided, having one terminal connected to the base of the transistor 51 and the other terminal connected to the junction 63 of the resistors 52 and 53. The resistor 62 is required in order to draw a small current from ground so as to bias the base a few volts negative with respect to ground. A small capacitor 64 is connected between the junction 24 and the junction 63, thereby causing the potential of the junction 63 to follow that of the output, with two beneficial effects. First, the emitter of the transistor 51 is bootstrapped, since the junction 63 is at the lower end of resistor 52, and second, the bootstrapping of the base of the transistor 51 is completed since the lower end of the resistor 62 is at the junction 63.

The embodiment of FIGURE 4 is thus seen to have high input impedance because all three electrodes of the input transistor 51 are bootstrapped. Gain and gain stability may both be high, because of the two high gain sections each comprising a common collector stage direct coupled to a common emitter stage.

Figure 5:
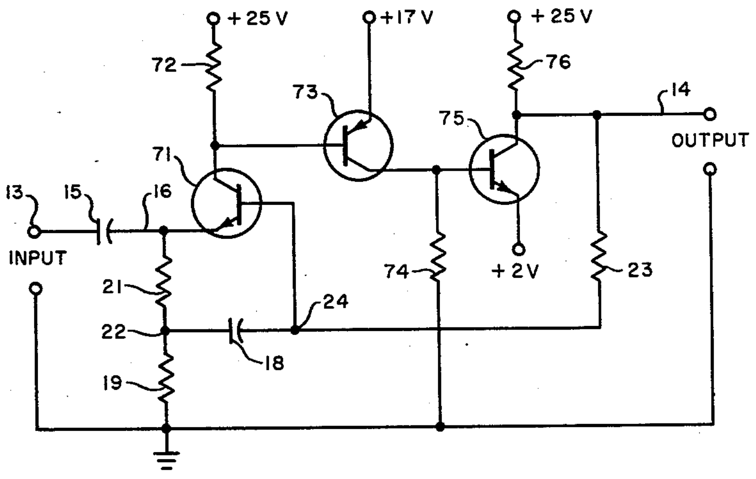
FIGURE 5 is a schematic diagram of another embodiment which employs three transistors.

In FIGURE 5 there is shown an embodiment of the invention employing three transistors one of which is of complementary symmetrical type as referred to the other two. This embodiment may have higher gain and higher gain stability than the embodiment of FIGURE 2, although at the sacrifice of input impedance.

Considering the circuit of FIGURE 5 in detail, the input conductor 16 is connected to the emitter of an NPN transistor 71 the collector of which is connected through a load resistor 72 to a source of positive potential and the base of which is connected to the junction 24. The collector of the transistor 71 is connected directly to the base of a PNP transistor 73 the collector of which is connected through a load resistor 74 to ground and the emitter of which is connected directly to a source of moderate positive potential. The collector of the transistor 73 is connected directly to the base of an NPN transistor 75 the collector of which is connected through a load resistor 76 to a source of positive potential and the emitter of which is connected to a source of low positive potential. The output conductor 14 is connected to the collector of the transistor 75.

In considering the operation of the circuit of FIGURE 5, it is noted that the first amplifying section comprises the transistor 71 connected in a common base configuration. This section has positive gain, that is, the output has the same phase as the input. The second section comprises the two common emitter stages, each having negative gain, that is, each exhibiting phase reversal. The overall result is that, as in the other embodiments, the output on conductor 14 has the same phase as the input.

The negative feedback loop is similar to that of FIGURE 2 but it is noted that the junction 24 is connected to the base of the transistor 71. The voltages and currents are such that the resistor 25, as shown in FIGURES 1 and 4, is not required, and accordingly unidirectional feedback is 100%. As before, the input electrode, in this case the emitter of the transistor 71, is bootstrapped by connecting the lower end of the resistor 21 to the junction 22, in order to raise the input impedance. However, the input impedance is not as high as in the embodiment of FIGURE 2 because the common base circuit inherently has a lower input impedance than the common emitter circuit. However, an advantage is the higher gain and higher gain stability obtainable because of the three amplifying stages. Gain stability is also increased by the fact that only the base current of the first stage flows in the feedback circuit. For the same reason, the feedback circuit may be of higher impedance, resulting in decreased loading of the output stage thereby, and permitting use of a smaller condenser 18. Another feature of the embodiment of FIGURE 5 is that but one power supply having a single polarity with respect to ground is required.

It is apparent from the foregoing that an amplifier in accordance with the invention provides high input impedance, high direct current stability, high gain, high gain stability, and high linearity. The requirements of the particular application will control the details of the circuit employed. The embodiment of FIGURE 2 is, perhaps, the simplest, requiring but two transistors to obtain a gain of 100 and an input impedance of one megohm. If higher input impedance and gain are required, the circuit of FIGURE 3 may be used. The embodiment of FIGURE 4 provides higher gain than that of FIGURE 2 without using a vacuum tube but requires four transistors. If a lower impedance can be tolerated, the embodiment of FIGURE 5 can provide higher gain than that of FIGURE 2 and in addition a simpler power supply suffices.

While a number of specific embodiments of the invention have been described, many modifications of these embodiments will occur to those skilled in the art. It is therefore desired that the protection afforded by Letters Patent be limited only by the true scope of the appended claims.

What is claimed is:

1. An amplifier comprising a pentode vacuum tube including a cathode, a control grid, a screen grid, a suppressor grid and an anode, first and second transistors each including a base, a collector, and an emitter, said first transistor being connected in a common collector amplifier circuit, said second transistor being connected in a common emitter amplifier circuit, a ground connection common to said tube and said transistors, said tube being connected in a common cathode amplifying circuit with the input applied between grid and ground and including individual resistors connecting the screen and anode to a source of positive potential, a direct connection between said anode and the base of said first transistor, a direct connection between the emitter of said first transistor and the base of said second transistor, a voltage divider comprising a first resistor, a first capacitor and a second resistor serially connected in that order from the collector of said second transistor to ground, a direct connection from said cathode to the junction of said first resistor and said first capacitor, and a second capacitor connected between said screen grid and said cathode.

2. Apparatus according to claim 1 further comprising a third resistor connected between said control grid and the junction of said first capacitor and said second resistor.

3. An amplifier, comprising, first and second amplifying sections having a common ground circuit, said first section comprising first and second transistors each having a base, a collector and an emitter, said first transistor being connected in a common collector amplifying circuit and being direct coupled to said second transistor which is connected in a common emitter amplifying circuit, the input to the amplifier being applied between the base of said first transistor and ground, said second section comprising third and fourth transistors each having a base, a collector and an emitter, said third transistor being connected in a common collector amplifying circuit and being direct coupled to said fourth transistor which is connected in a common emitter amplifying circuit, the output from the amplifier being taken between the collector of said fourth transistor and ground, a direct connection from the collector of said second transistor to the base of said third transistor, a voltage divider comprising a first resistor, a first capacitor and a second resistor serially connected in that order from the collector of said fourth transistor to ground, a direct connection between the emitter of said second transistor and the junction of said first resistor and said first capacitor, a third resistor connected between the base of said first transistor and the junction of said first capacitor and said second resistor, a direct connection between the collector of said first transistor and the junction of said first capacitor and said second resistor, said common collector circuit of said first transistor including fourth and fifth resistors serially connected between said emitter of said first transistor and source of potential, a sixth resistor connected between said base of said first transistor and the junction of said fourth and fifth resistors, and a second capacitor connected between the junction of said first resistor and said first capacitor and the junction between said fourth and fifth resistors.

References Cited in the file of this patent

UNITED STATES PATENTS

| | | |
|---|---|---|
| 2,760,007 | Lozier | Aug. 21, 1956 |
| 2,789,164 | Stantley | Apr. 16, 1957 |
| 2,858,379 | Stantley | Oct. 28, 1958 |
| 2,879,410 | Loeb | Mar. 24, 1959 |